United States Patent
Jung

[11] Patent Number: 6,067,145
[45] Date of Patent: May 23, 2000

[54] LIGHT EXPOSING DEVICE FOR MANUFACTURING SEMICONDUCTOR DEVICE WHICH FURTHER REMOVES ASYMMETRICAL ABERRATION

[75] Inventor: Yeon-Wook Jung, Uijungbu, Rep. of Korea

[73] Assignee: Samsung Aerospace Industries, Ltd., Kyungsangnam-do, Rep. of Korea

[21] Appl. No.: 08/611,906

[22] Filed: Mar. 6, 1996

[30] Foreign Application Priority Data

Mar. 28, 1995 [KR] Rep. of Korea ............... 95-6764

[51] Int. Cl.⁷ ............... G03B 27/42; G03B 27/52; G03B 27/54
[52] U.S. Cl. ............... 355/53; 355/55; 355/67
[58] Field of Search ............... 355/53, 54, 55, 355/61, 77; 356/399, 400, 401

[56] References Cited

U.S. PATENT DOCUMENTS

| | | |
|---|---|---|
| 4,723,845 | 2/1988 | Mizutani et al. ............... 356/375 |
| 4,891,663 | 1/1990 | Hirose ............... 355/53 |
| 4,943,733 | 7/1990 | Mori et al. ............... 250/548 |
| 4,977,426 | 12/1990 | Hirose ............... 355/53 |
| 5,105,075 | 4/1992 | Ohta et al. ............... 250/201.2 |
| 5,311,362 | 5/1994 | Matsumoto et al. ............... 355/71 |
| 5,379,090 | 1/1995 | Shiraishi ............... 355/67 |
| 5,432,608 | 7/1995 | Komoriya et al. ............... 356/401 |

*Primary Examiner*—Richard Moses
*Assistant Examiner*—Shival Virmani
*Attorney, Agent, or Firm*—Finnegan, Henderson, Farabow, Garrett & Dunner, L.L.P.

[57] ABSTRACT

A light-exposing device for making a semiconductor device. A reticle has patterns to be exposed to light. A blind controls a light-exposing area of the reticle. An optical system between the blind and the reticle condenses light passing through the blind. Adjacent patterns on a reticle are consecutively projected by superimposing light-exposing energy. An extra optical system condenses light passing through the blind. The usable area of the reticle is maximized; the interval between patterns is not critical; and inferiority by either lack or excess of the exposure to light between the patterns is reduced.

7 Claims, 3 Drawing Sheets

LIGHT EXPOSING DEVICE FOR MANUFACTURING SEMICONDUCTOR DEVICE WHICH FURTHER REMOVES ASYMMETRICAL ABERRATION

BACKGROUND OF THE INVENTION (1) Field of the Invention

The present invention relates to a light-exposing device for manufacturing a semiconductor device. More particularly, it relates to a light-exposing device for manufacturing a semiconductor device which is capable of forming patterns on a reticle consecutively by creating the superposition of the light-exposing energy and projecting the patterns on the reticle to a plate, using an extra optical system condensing light passing through a blind, in a stitching process through which a screen is exposed to light by pattern synthesis.

(2) Description of the Related Art

In order to form an electronic circuit on a semiconductor wafer or a glass substrate of a liquid crystal display device, patterns on which electronic circuits are formed are required. A glass plate having such patterns is referred to as a reticle or mask.

A light-exposing device projects the pattern on the reticle onto a semiconductor wafer or a substrate of a liquid crystal display device. When the size of a display is beyond the light-exposing range of a projection lens in the steps in the manufacturing of a liquid crystal display device, a screen synthesis is carried out by dividing the display screen and selectively exposing it to light.

To form patterns on the reticle successively for the screen synthesis in manufacturing order, the patterns on the reticle other than the pattern that is being used in the processing, have to be covered artificially. A blind is used to cover the rest of the patterns artificially from the light in manufacturing order to project the patterns on the reticle as stated above.

Controlling the above-mentioned blind and selectively exposing the pattern on the reticle to light is a stitching process, which acts as an important factor for improving the productivity in the steps of exposing the pattern of the liquid crystal display device to light.

As illustrated in FIG. 1, a conventional light-exposing device includes: a light source 1 having an ultra high pressure mercury-arc lamp 1; a reflector 2; a condenser lens 3; a blind 4; a reticle 5; a projection lens 6; and a plate 7.

A dot of light produced by the light source 1 is diffused into a surface of light by the reflector 2. The surface of light impinges on the condenser lens 3. The condenser lens 3 condenses the surface of light and irradiates it on the reticle 5 having patterns.

The blind 4 covers the reticle 5 except for the pattern to be exposed. Accordingly, light from the condenser lens 3 is irradiated on the pattern of the reticle 5 to be exposed to light through the blind 4. The projection lens 6 projects the pattern on the reticle 5 not covered by the blind 4 onto the surface of the plate 7. A resist on the plate 7 is exposed to light influenced by the pattern on the reticle 5.

At this point, the light-exposing energy irradiated on each pattern on the reticle 5 is distributed only to the pattern to be exposed to light by the light irradiated through the blind 4, as illustrated in FIG. 4, and thus the light-exposing energy is not superimposed.

When the pattern on the reticle 5 is formed as shown in FIG. 2, the size of the blind 4 that covers the remaining parts other than the pattern to be exposed to light is adjusted to be bigger than the pattern that is exposed to light. That is, since there is a possibility that the quality of the pattern exposed to light may be deteriorated by the dispersion of light irradiated on the edge of the blind 4, the blind 4 is adjusted so that the part to which the light is irradiated may be bigger than the pattern exposed to light on the reticle 5.

Accordingly, while the pattern on the plate 7 is projected contiguously without any space as illustrated in FIG. 3, the pattern to be exposed to light on the reticle 5 has to be formed to keep a regular interval as illustrated in FIG. 2.

Thus, with the conventional technique, an efficiently usable area in the reticle is reduced, and precision of location for keeping interval with each pattern when a pattern is formed has to be considered.

Further, there is a possibility that when a pattern projected on a plate is not located precisely, the exposure to light between the patterns may be excessive or lack to result in deterioration of product.

SUMMARY OF THE INVENTION

The advantages and purpose of the invention will be set forth in part in the description which follows, and in part will be obvious from the description, or may be learned by practice of the invention. The advantages and purpose of the invention will be realized and attained by means of the elements and combinations particularly pointed out in the appended claims.

It is an object of the present invention to provide a light-exposing device for manufacturing a semiconductor device which is capable of forming patterns on a reticle consecutively by creating the superposition of the light-exposing energy and projecting the patterns on the reticle to a plate, using an extra optical system condensing a light passing through a blind, in a stitching process through which a screen is exposed to light by pattern synthesis.

In order to achieve the above object, this invention includes: a reticle on which patterns exposed to light are formed; a blind controlling a light-exposing region on the reticle; an optical system mounted between the blind and the reticle to condense the light passing through the blind and irradiate it on a plate.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate one embodiment of the invention and together with the description, serve to explain the principles of the invention. In the drawings.

DETAILED DESCRIPTION OF THE PREFERRED EMBODIMENTS

A preferred embodiment of the present invention will be described in detail with reference to the accompanying drawings.

Figure 5:
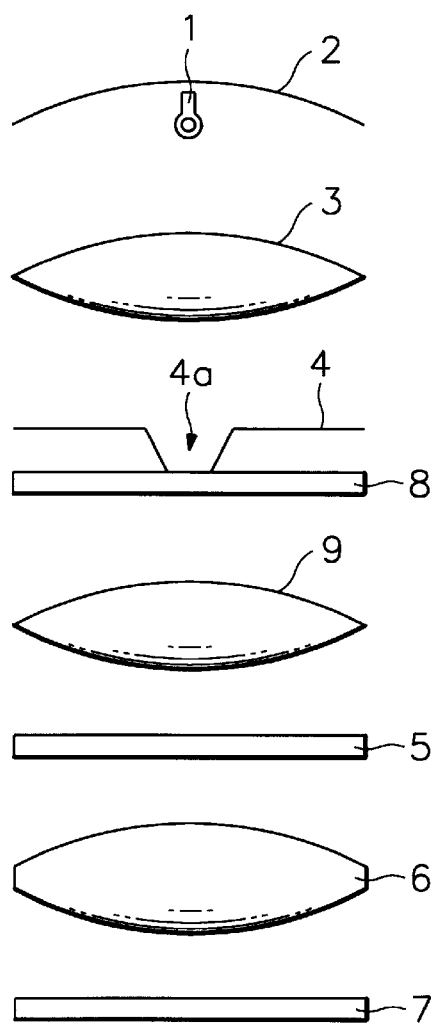
FIG. 5 is a schematic view of a light-exposing device according to a preferred embodiment of this invention.

FIG. 5 illustrates a light-exposing device according to a preferred embodiment of the present invention. A light source 1 outputs a dot light source. A reflector 2 diffuses the dot light source produced by the light source 1 into a surface light source. A reticle 5 has a plurality of patterns to be exposed to light. A condenser lens 3 condenses light that is diffused through the reflector 2 and irradiates the condensed light on the reticle 5. A blind 4 controls a light-exposed region by covering the patterns except the pattern reticle 5 to be exposed to light. A correction lens 9 between the blind 4 and reticle 5 condenses the incident light through a correction plate 8 and irradiates the light on the reticle 5. A projection lens 6 projects the pattern of the reticle 5 to a plate 7.

The correction plate 8, according to the preferred embodiment of the present invention, compensates asymmetry caused by the thickness of the correction lens 9 and the reticle 5, and the correction plate 8 has the same quality of material and thickness as the reticle 5.

The correction lens 9, according to the preferred embodiment of the present invention, is composed of an optical system having an equal ratio of 1 to 1, in which asymmetrical aberrations such as distortion, comma, and such do not occur, and only a symmetric characteristic aberration such as a spherical aberration occurs within an predetermined range.

The following description refers to the operation of a light-exposing device according to the preferred embodiment of the present invention by the above structure.

A dot of light produced by the light source 1 including an ultra high pressure mercury-arc lamp is diffused to a surface source light by the reflector 2 and is incident on the condenser lens 3. The condenser lens 3 condenses the incident surface of light and irradiates the condensed light to the reticle 5 on which patterns to be exposed to light are formed.

At this point, the blind 4 covers the parts of the reticle 5 other than those parts to be exposed. Light passes through a light exposing area 4a of the blind 4. Accordingly, only selected light from the condenser lens 3 is irradiated to the reticle 5 through the blind 4.

The light-exposing area 4a has a predetermined size that is bigger than the pattern exposed to light. Light from the light exposing area 4a passes through the correction plate 8 and is incident on the correction lens 9.

Light passing through the light-exposing area 4a and the correction plate 8 is irradiated on the reticle 5 through the correction lens 9. A portion of the pattern on the reticle 5 corresponding to the light exposing area 4a is then projected on the plate 7 by the projection lens 6.

Figure 7:
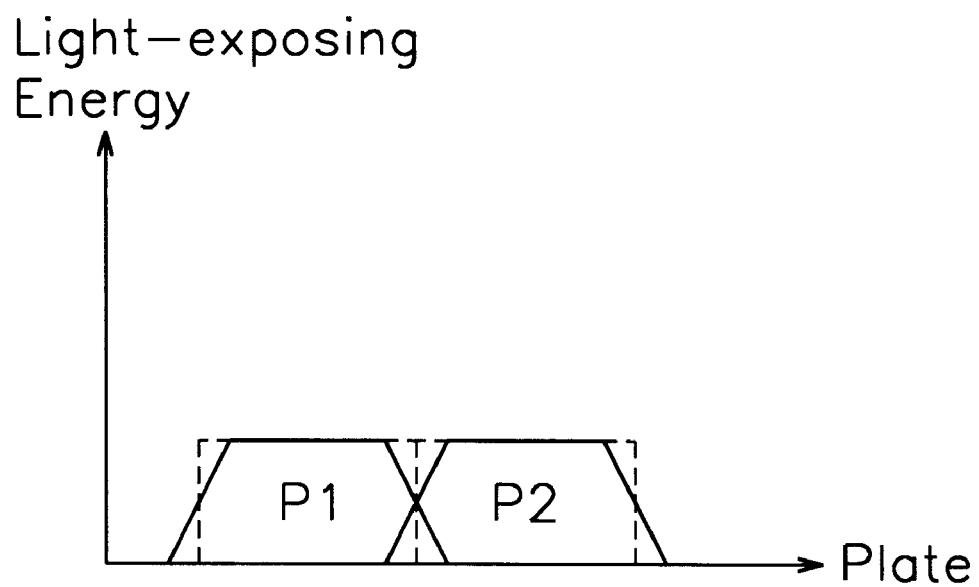
FIG. 7 is a graph showing the state of light-exposing energy projecting on the plate in the light-exposing device according to the preferred embodiment of this invention.

In the boundary of the light-exposing area 4a, light-exposing energy having a predetermined grade shown in FIG. 7 is distributed centered around the boundary by a symmetrical characteristic aberration, such as a spherical aberration, created on purpose by the correction lens 9.

Figure 6:
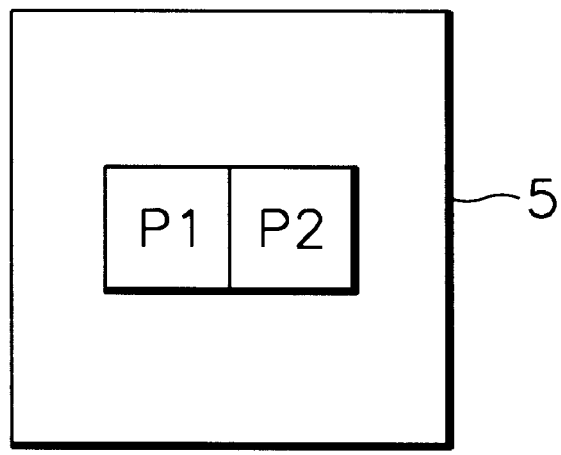
FIG. 6 is a schematic view of patterns formed on a reticle of a light-exposing device according to the preferred embodiment of this invention.

As shown in FIG. 6, a reticle 5 according to the preferred embodiment of the invention may have two patterns P1 and P2. The patterns P1 and P2 are adjacent to each other. After the first pattern P1 on the reticle 5 is exposed to light, the second pattern P2 is exposed to light. FIG. 7 shows the distribution of light-exposing energy having a predetermined grade after the second exposure.

Figure 1:
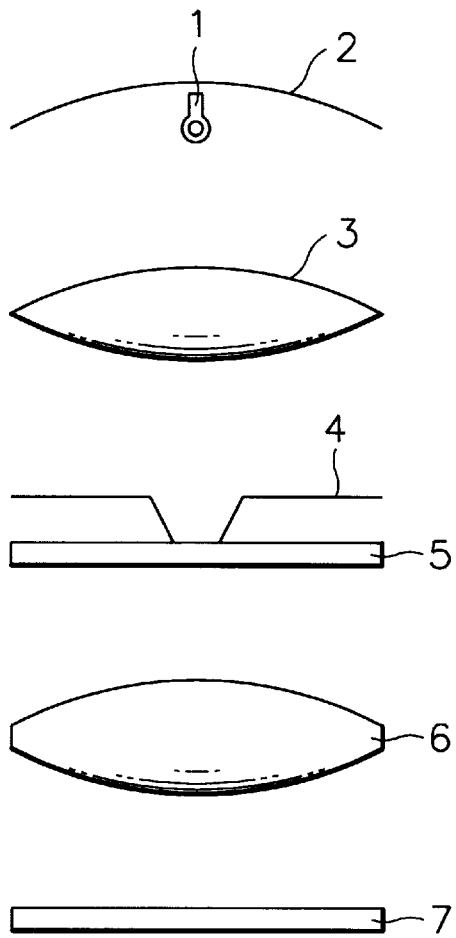
FIG. 1 is a schematic view of a conventional light-exposing device.
Figure 2:
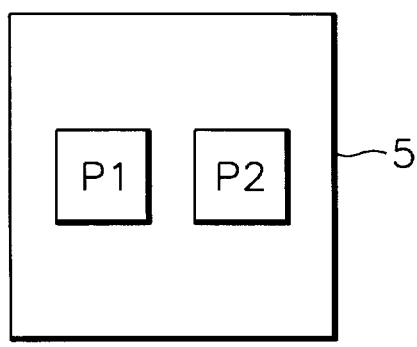
FIG. 2 is a schematic view of a conventional reticle.
Figure 3:
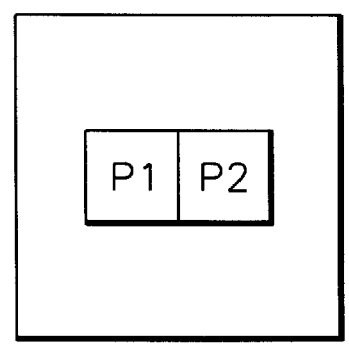
FIG. 3 is a schematic diagram of a conventional pattern projected on a plate.
Figure 4:
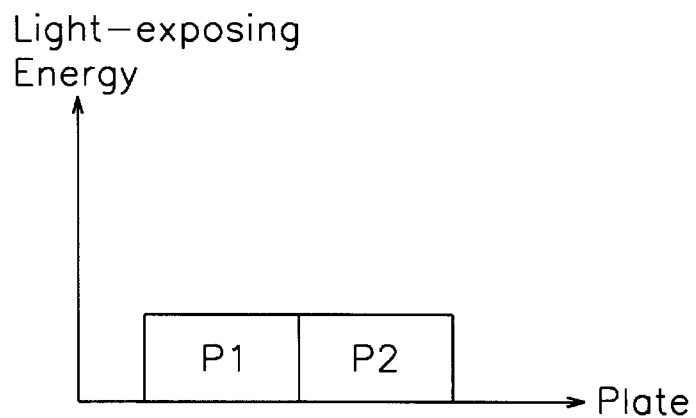
FIG. 4 is a graph showing the state of light-exposing energy projecting on the plate in the conventional light-exposing device.

Accordingly, a superposition of a light-exposing energy different from the distribution of the energy exposed to light relevant to each conventional pattern as illustrated in FIG. 4 occurs centering the light-exposing area according to the light-exposing process of the patterns P1 and P2 as illustrated in FIG. 7.

The dotted lines in FIG. 7 show the distribution of light-exposing energy equivalent to the light passing the light-exposing area of the blind 4.

Accordingly, the distribution of the light-exposing energy in the boundary of the light-exposing area 4a is identical with that of the light-exposing energy equivalent to the different part exposed to light, and thus, the pattern relevant to the boundary of the light-exposing area is projected on the plate.

Because the light-exposing energy is superimposed by the correction lens 9 as stated above, each pattern of the reticle 5 according to the preferred embodiment of the present invention is exposed to light normally, though the patterns are formed continuously without any regular interval.

By replacing the correction lens 9 with a reflector optical system using a mirror, the light-exposing process may be performed on the reticle continuously.

As stated above, the light-exposing device according to the preferred embodiment of the present invention is capable of forming patterns on a reticle consecutively by creating the superposition of the light-exposing energy and projecting the patterns on the reticle to a plate, using an extra optical system condensing a light passing through a blind, in a stitching process through which a screen is exposed to light by pattern synthesis.

Further, by forming the reticle consecutively, the usable area of the reticle may be maximized and the precision of location for keeping the interval according to the formation of each pattern need not be considered.

In addition, the inferiority by either lack or excess of the exposure to light between the patterns is reduced to improve the productivity, and the production produced per unit time can be improved by reducing the time for arraying a reticle and a plate.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. A light-exposing device for making a semiconductor device, comprising:
    a reticle having patterns to be exposed to light;
    a blind for controlling a light-exposing area of the reticle;
    a condenser lens for condensing light from a light source; and
    an optical system, placed between the blind and the reticle, comprising correction means for imaging the blind on the reticle in equi-magnification and for generating symmetrical aberrations within a predetermined range over the entire reticle.

2. A light-exposing device according to claim 1, wherein the symmetrical aberrations comprise a spherical aberration.

3. A light-exposing device according to claim 1, wherein the correction means comprises at least one of a correction plate and a correction lens which corrects asymmetrical aberrations resulting from the thickness and material of the reticle.

4. A light-exposing device according to the claim 1, wherein the reticle has a plurality of consecutive adjacent patterns.

5. A light-exposing device for manufacturing a semiconductor device, comprising:

a light source for producing a dot of light;

a reflector for diffusing the dot of light into a surface of light;

a condenser lens for condensing light from the reflector;

a reticle having a plurality of patterns;

a blind for controlling a light-exposing area of the reticle;

a projection lens for projecting a pattern of the reticle; and correction means, placed between the blind and the reticle, for imaging the blind on the reticle in equi-magnification and for generating symmetrical aberrations within a predetermined range over the entire reticle.

6. A light-exposing device according to the claim 5, wherein the reticle has a plurality of consecutive adjacent patterns.

7. A light-exposing device according to claim 5, wherein the correction means comprises at least one of a correction plate and a correction lens which corrects asymmetrical aberrations resulting from the thickness and material of the reticle.

* * * * *